(12) United States Patent
Park et al.

(10) Patent No.: US 7,532,512 B2
(45) Date of Patent: May 12, 2009

(54) NON-VOLATILE MEMORY DEVICE AND METHOD OF HANDLING A DATUM READ FROM A MEMORY CELL

(75) Inventors: Jaeseok Park, Seoul (KR); Dae Sik Song, Gyeonggi-Do (KR)

(73) Assignees: STMicroelectronics Asia Pacific Pte. Ltd, Singapore (SG); Hynix Semicoductor, Inc., Kyounki-Do (KR)

( * ) Notice: Subject to any disclaimer, the term of this patent is extended or adjusted under 35 U.S.C. 154(b) by 95 days.

(21) Appl. No.: 11/833,400

(22) Filed: Aug. 3, 2007

(65) Prior Publication Data

US 2009/0034351 A1 Feb. 5, 2009

(51) Int. Cl.
- G11C 11/34 (2006.01)
- G11C 16/06 (2006.01)
- G11C 7/10 (2006.01)
- G11C 7/00 (2006.01)
- G11C 8/00 (2006.01)

(52) U.S. Cl. ............... 365/185.12; 365/185.23; 365/185.25; 365/189.02; 365/191; 365/203; 365/230.02; 365/230.06

(58) Field of Classification Search ........... 365/185.12, 365/185.23, 185.2, 189.02, 191, 203, 230.02, 365/230.06
See application file for complete search history.

(56) References Cited

U.S. PATENT DOCUMENTS

| | | | | |
|---|---|---|---|---|
| 5,022,001 A * | 6/1991 | Kowalski et al. | ....... | 365/185.25 |
| 5,822,260 A | 10/1998 | Tamaki | ....... | 365/203 |
| 6,243,312 B1 | 6/2001 | Kim | ....... | 365/207 |
| 2004/0153902 A1* | 8/2004 | Machado et al. | ....... | 714/710 |
| 2005/0117421 A1 | 6/2005 | Pille et al. | ....... | 365/203 |
| 2007/0223295 A1* | 9/2007 | Kim | ....... | 365/203 |

* cited by examiner

Primary Examiner—Ly D Pham
(74) Attorney, Agent, or Firm—Lisa K. Jorgenson; Allen, Dyer, Doppelt, Milbrath & Gilchrist, P.A.

(57) ABSTRACT

A memory device includes a pre-charge transistor for connecting/disconnecting the input line of a global data line driver to a supply voltage line. To reduce the flow of current through the pre-charge transistor even in a stand-by state, the pre-charge transistor is turned on when, at a same time, an enabling signal of a page buffer is asserted, and a low voltage functioning mode is selected and the memory device is not in a stand-by state. Alternatively, the memory device may be in a stand-by state but the datum read from the memory is high. The pre-charge transistor is securely turned off in all other cases.

22 Claims, 4 Drawing Sheets

NON-VOLATILE MEMORY DEVICE AND METHOD OF HANDLING A DATUM READ FROM A MEMORY CELL

FIELD OF THE INVENTION

The present invention relates to memory devices, and more particularly, to a memory device that includes a global data line driver with an improved architecture for preventing errors while transferring a read datum to a global data line of the memory device.

BACKGROUND OF THE INVENTION

Non-volatile memory devices organized and functioning in a page mode include a circuit, called a page buffer. The page buffer stores data to be programmed in the addressed locations of the memory cell array, and is to be read from addressed locations of the memory cell array. The page buffer includes a data driver for each memory cell of the page for outputting a read datum.

To understand the functioning of a page buffer during a read operation, reference is directed to the scheme of FIG. 1. Substantially, during every read operation, the data driver of the page buffer PAGE BUFFER transfers a datum DATA read from the respective memory cell to an output node of the buffer when an enabling signal PBDO is asserted.

The outputs of the data drivers are connected to the inputs of a multiplexer COLUMN MUX that selects the datum provided by a data driver identified by the address signals YA<i>, YB<i> and YC<i>. This selected datum is transferred to a global data line of the memory device by a global data line driver when a second enabling signal DOEN is asserted.

As depicted in FIG. 1, a datum read from a memory cell propagates through four transistors in cascade for reaching the global data line driver. If this datum is at the supply voltage level, the voltage drops on these transistors may be relevant and the signal nDL could not be at a voltage level sufficient to turn on the transistor N0.

Therefore, in this situation the signal nDL_N would remain high and thus, when the second enabling signal DOEN is asserted, the two-input inverter transfers an incorrect datum GDL to the global data line of the memory device. This drawback is likely to occur when the memory is functioning with a relatively low supply voltage (1.8V, for example).

This problem may be overcome in architectures of memory devices that include a global data line driver, as depicted in FIG. 2. In these memory devices, the global data line driver usually includes a pre-charge transistor P0 for connecting/disconnecting the input line of the global data line driver to a supply voltage line of the memory device. The pre-charge transistor P0 is switched on by the control signal PRE_N when the enabling signal PBDO of the data driver of the page buffer is asserted, and when a low (supply) voltage functioning mode of the memory device is selected. This low voltage functioning mode is usually selected by switching high an externally provided logic command SUPPLY18.

With the above approach, the datum is correctly transferred to the global data line even when functioning in low voltage mode. Unfortunately, in memory devices that include the circuit of FIG. 2, power consumption is found to be greater than in memory devices with the circuit of FIG. 1.

The memory devices that include the circuit of FIG. 2 are more power consuming than the memory devices that include the circuit of FIG. 1 because of a small, though significant, flow of current through the transistor P0 even in a stand-by state.

This current is very small even when the datum nDL is low because the transistor P0 usually has a relatively large resistance, even in a conduction state. This increase of current absorption of the pre-charge transistor P0 exists even when the datum nDL is low. In a memory device, there are many global data line drivers, and the currents absorbed by them when the memory is in a stand-by state and when the read datum nDL is low add up.

SUMMARY OF THE INVENTION

In view of the foregoing background, an object of the invention is to reduce power consumption of a memory device that includes a global data line.

This and other objects, advantages and features in accordance with the invention are provided by a method comprising turning on a pre-charge transistor when, at the same time, the enabling signal PBDO of the page buffer is asserted. A low voltage functioning mode may be selected, and the memory device is not in a stand-by state. Alternatively, the memory device may be in a stand-by state but the datum nDL read from the memory cell is high. The pre-charge transistor may be securely turned off in all other cases.

BRIEF DESCRIPTION OF THE DRAWINGS

The invention will be described referring to the attached drawings, wherein.

DETAILED DESCRIPTION OF THE PREFERRED EMBODIMENTS

Figure 1:
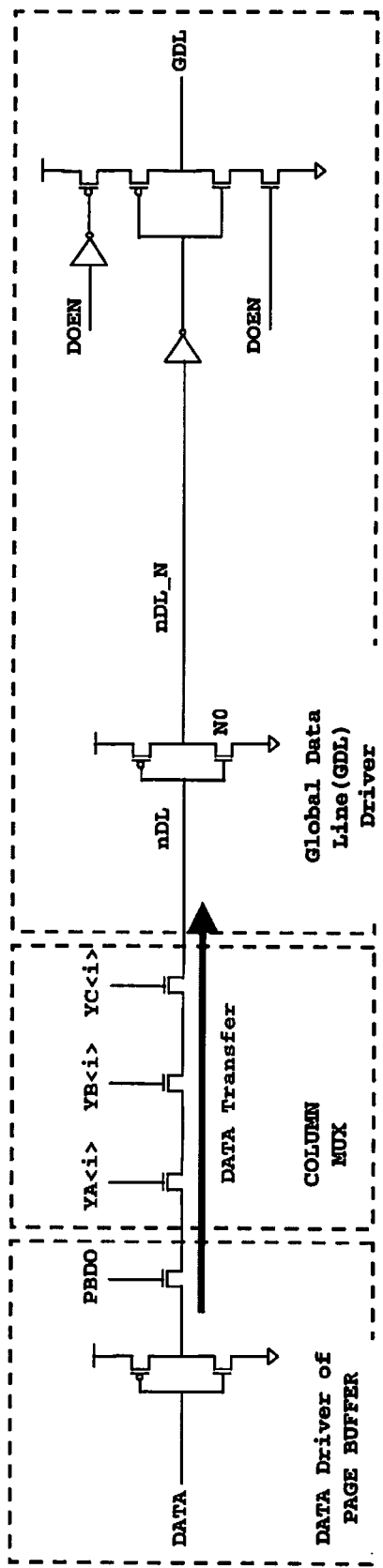
FIG. 1 is a circuit diagram of a global data line driver according to the prior art.
Figure 2:
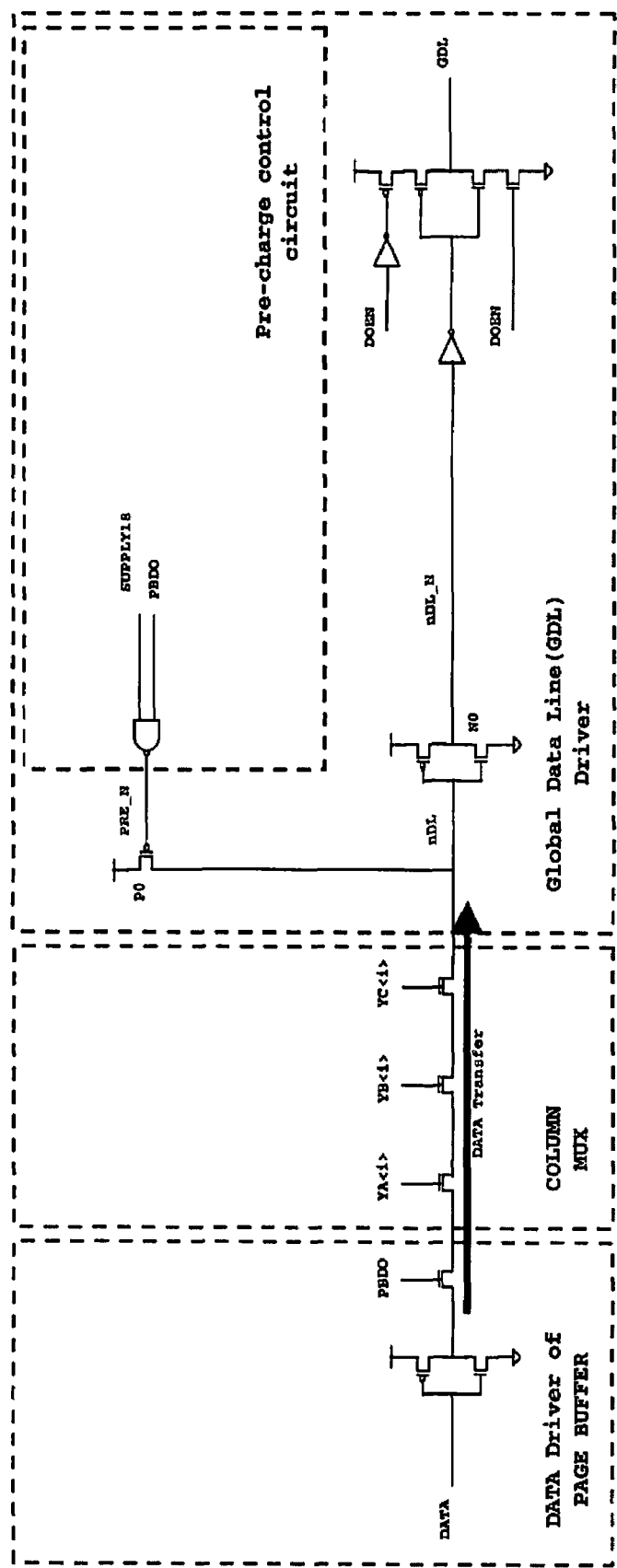
FIG. 2 is a circuit diagram of another embodiment of a global data line driver according to the prior art.
Figure 3:
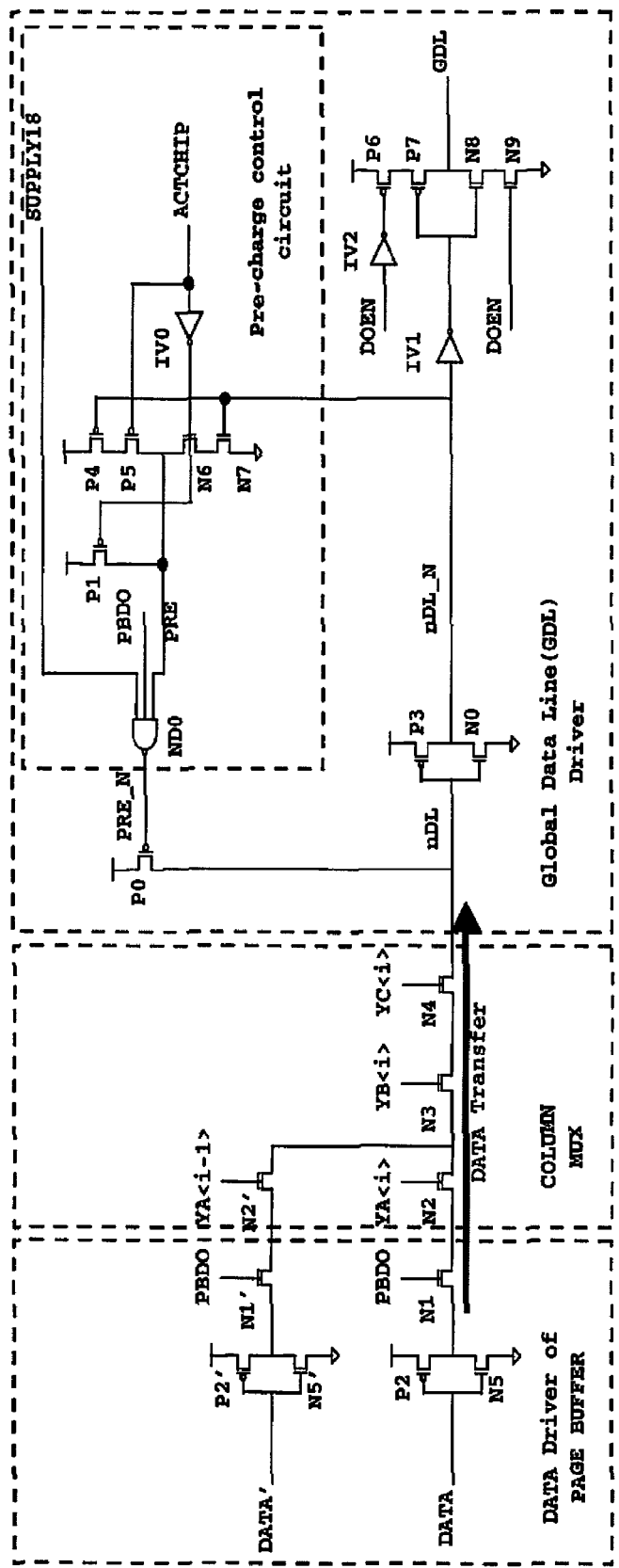
FIG. 3 is a circuit diagram of a global data line driver of a memory device according to the present invention.

A preferred embodiment of a global data line driver of a memory device is depicted in FIG. 3. Differently from the circuit of FIG. 2, the illustrated global data line driver has a pre-charge control circuit that generates the control signal PRE_N to turn on the pre-charge transistor P0 only when it is necessary to pre-charge the input line of the global data line driver for the reasons stated in the background section.

The transistor P0 is on only when at the same time the external command SUPPLY18 is high. That is, the memory device is functioning in a low voltage mode. The enabling signal PBDO is high (i.e., the page buffer is ready for outputting a read datum) when an internally generated auxiliary logic signal PRE is high. The PRE signal is high when the stand-by signal ACTCHIP is high (i.e., the memory device is not in a stand-by state) or when the stand-by signal ACTCHIP is low (i.e., the memory device is in a stand-by state) but the datum nDL input to the global data line driver is high.

Those skilled in the art will recognize that the circuit for generating the auxiliary signal PRE may be realized in many other forms, such as using logic gates, for example.

Figure 4:
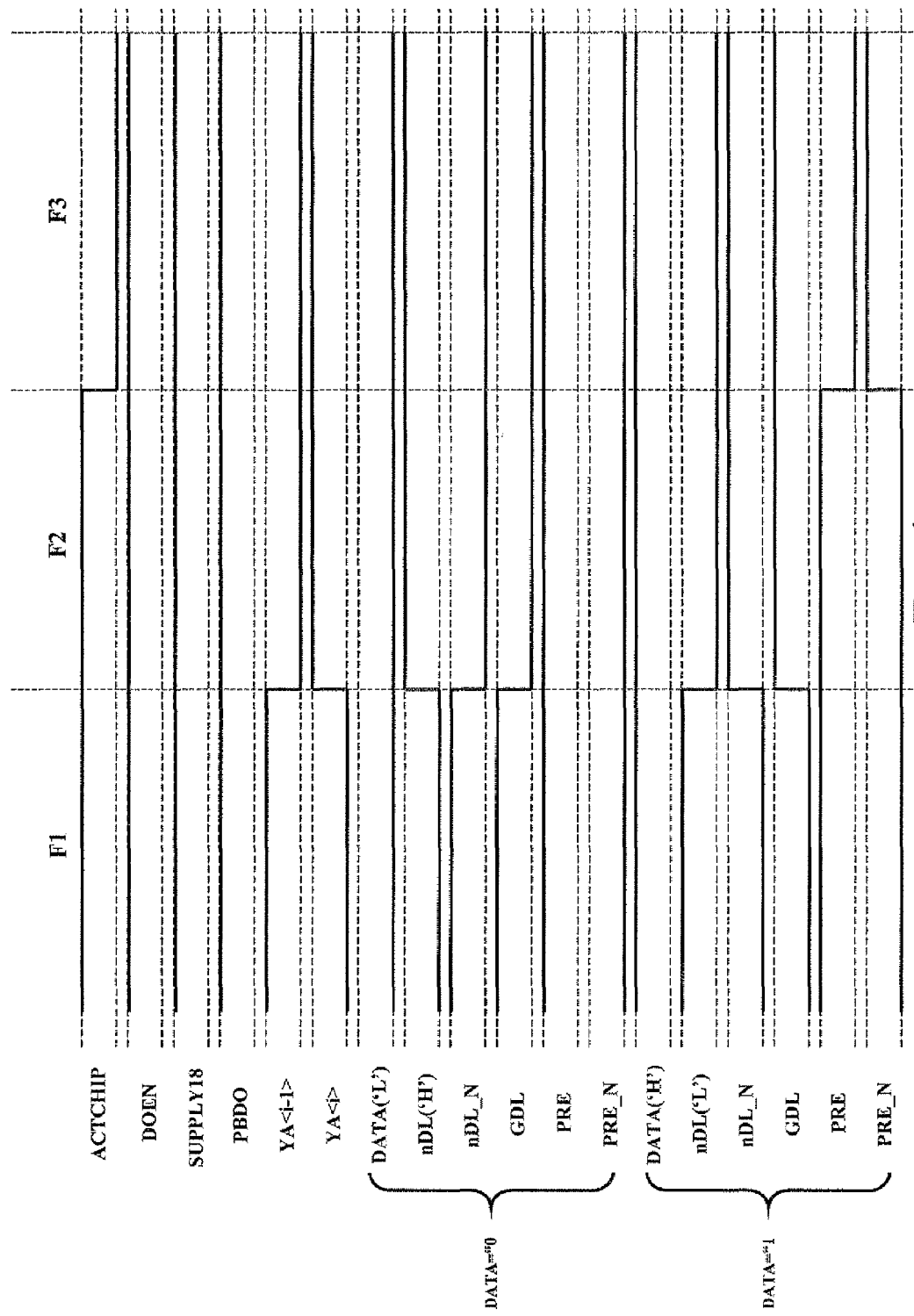
FIG. 4 is a timing diagram of the main signals of the memory device according to the present invention.

FIG. 4 is a sample timing diagram of the main signals of the circuit of FIG. 3 for a read operation during which the memory device switches from an active state to a stand-by state.

Step F1: DATA is prepared in a data driver of a page buffer (P2 PMOS and N5 NMOS). A PBDO signal is a 1(VDD). YB<i> and YC<i> signals are also a 1, and they remain at the high logic level for all steps. The address signal YA<i> is a 0 (GND), thus data transfer from the i-th page buffer is not carried out. In contrast, the address signal YA<i−1> is a 1, thus the (i−1)-th page buffer is selected (P2' PMOS and N5' NMOS). The selection of page buffers is sequential, thus the signals YA<i−1> and YA<i> can not be both active.

The read datum DATA' is transferred to the input line nDL of the global data line driver through the NMOS transistors N1', N2', N3 and N4. The signal SUPPLY18 signal is a 1 during all steps for selecting a low voltage functioning mode. The memory device is carrying out a read operation, thus it is in an active state (the signal ACTCHIP is a 1). The second enabling signal DOEN is a 1 and the global data line GDL is driven according to the value of DATA by the global data line driver.

If DATA is a 0 and DATA' is a 1, thus the line nDL is a 0, its inverted replica nDL_N is a 1 and the datum output on the global data line GDL is a 1. If DATA is a 1 and DATA' is a 0, the line nDL is a 1, its inverted replica nDL_N is a 0 and the datum output on the global data line GDL is a 0.

Because the signal ACTCHIP is a 1, the auxiliary signal PRE is a 1 regardless the value of DATA', thus PRE_N node is a 0 and the PMOS transistor P0 is in a conduction state.

Step F2: The address bit YA<i−1> is a 0 and YA<i> is a 1 and these levels are maintained constant during step F3. The datum DATA is transferred through the NMOS transistors N1, N2, N3 and N4 and the lines nDL, nDL_N and GDL are charged to the opposite values.

The auxiliary signal PRE and the control signal PRE_N are kept at their values from step F1. Therefore, the PMOS transistor P0 is still on. This helps charge the nDL line in case the DATA is L, that is, nDL is H.

Step F3: The selection signal ACTCHIP switches to a 0, thus the memory device enters a stand-by state. The auxiliary signal PRE is thus an inverted replica of the signal nDL_N. This is because the PMOS transistor P4 or the NMOS transistor N7 are in a conduction state together with the PMOS transistor P5 and the NMOS transistor N6.

If DATA is a 0, the nDL signal is a 1 and nDL_N is a 0, thus the auxiliary signal PRE is a 1, as in Step F2. The control signal PRE_N is a 0 and the PMOS transistor P0 is still in a conduction state and charges the line nDL. The line nDL is latched at the value 1.

If DATA is a 1, the nDL signal is a 0 and nDL_N is a 1, thus the auxiliary signal PRE switches from a 1 to a 0 and the control signal PRE_N switches from a 0 to a 1. Therefore, the PMOS transistor P0 is turned off and there is no current consumption.

With the illustrated global data line driver the pre-charge transistor P0 is kept in an off state when the memory device is in stand-by and the datum nDL is low. Comparative tests have demonstrated that the power consumption of a memory device equipped with the illustrated pre-charge transistor is significantly reduced during a stand-by state.

That which is claimed:

1. A non-volatile memory device functioning in a page mode and comprising:
   a page buffer comprising a plurality of data output drivers to be enabled by a first enabling signal to output data therefrom;
   a selection multiplexer to be controlled by a plurality of address signals to select the data to be output from one of said plurality of data output drivers; and
   a global data line driver coupled to an output of said selection multiplexer to transfer the selected data based on a second enabling signal, said global data line driver comprising
   an input line to receive the selected data from said selection multiplexer,
   a pre-charge transistor to be turned on by a pre-charge control signal to connect the input line to a voltage reference, and
   a pre-charge control circuit to generate the pre-charge control signal based on receiving the first enabling signal, a command signal to select a low voltage functioning mode of the non-volatile memory device, an inverted replica of the selected data, and a stand-by signal to set the non-volatile memory device in a stand-by state.

2. The non-volatile memory device of claim 1, wherein said global data line driver further comprises:
   a first inverter coupled to the input line to receive the selected data;
   an internal line coupled to said first inverter to receive the inverted replica of the selected data;
   a second inverter coupled to the internal line and to be controlled by a second enabling signal to transfer the inverted replica of the selected data; and
   an output line to receive the transferred inverted replica of the selected data.

3. The non-volatile memory device of claim 1, wherein said pre-charge control circuit comprises a two-input inverter to receive the inverted replica of the selected data and the stand-by signal to set the non-volatile memory device in a stand-by state, said two-input inverter including an output to provide an auxiliary signal.

4. The non-volatile memory device of claim 3, wherein a logic value of the auxiliary signal is high when a logic value of the stand-by signal is low, and a logic value of the inverted replica of the selected data is low.

5. The non-volatile memory device of claim 3, wherein a logic value of the auxiliary signal is low when a logic value of the stand-by signal is low, and a logic value of the inverted replica of the selected data is high.

6. The non-volatile memory device of claim 3, wherein a logic value of the auxiliary signal is to float when a logic value of the stand-by signal is high.

7. The non-volatile memory device of claim 3, wherein said pre-charge control circuit further comprises:
   a switch to connect the output of said two-input inverter to a voltage reference when a logic value of the stand-by signal is high; and
   a NAND gate to receive as input the auxiliary signal, the first enabling signal and the command signal to have a logic value that is to be high to select the low voltage functioning mode of the non-volatile memory device, said NAND gate including an output to provide the pre-charge control signal to said pre-charge transistor.

8. A memory device comprising:
   a memory array;
   a page buffer coupled to said memory array and comprising a plurality of data output drivers to be enabled by a first enabling signal to output data from said memory array;
   a selection multiplexer to be controlled by a plurality of address signals to select the data to be output from one of said plurality of data output drivers; and
   a global data line driver coupled to an output of said selection multiplexer to transfer the selected data based on a second enabling signal, said global data line driver comprising
   an input line to receive the selected data from said selection multiplexer,
   a pre-charge transistor to be turned on by a pre-charge control signal to connect the input line to a voltage reference, and
   a pre-charge control circuit to generate the pre-charge control signal based on receiving the first enabling signal, a command signal to select a low voltage functioning mode of the memory device, and a stand-by signal to set the memory device in a stand-by state.

9. The memory device of claim 8, wherein generating the pre-charge control signal is further based on receiving an inverted replica of the selected data.

10. The memory device of claim 9, wherein said global data line driver further comprises:
    a first inverter coupled to the input line to receive the selected data;
    an internal line coupled to said first inverter to receive the inverted replica of the selected data;
    a second inverter coupled to the internal line and to be controlled by a second enabling signal to transfer the inverted replica of the selected data; and
    an output line to receive the transferred inverted replica of the selected data.

11. The memory device of claim 9, wherein said pre-charge control circuit comprises a two-input inverter to receive the inverted replica of the selected data and the stand-by signal to set the memory device in a stand-by state, said two-input inverter including an output to provide an auxiliary signal.

12. The memory device of claim 11, wherein a logic value of the auxiliary signal is high when a logic value of the stand-by signal is low, and a logic value of the inverted replica of the selected data is low.

13. The memory device of claim 11, wherein a logic value of the auxiliary signal is low when a logic value of the stand-by signal is low, and a logic value of the inverted replica of the selected data is high.

14. The memory device of claim 11, wherein a logic value of the auxiliary signal is to float when a logic value of the stand-by signal is high.

15. The memory device of claim 11, wherein said pre-charge control circuit further comprises:
    a switch to connect the output of said two-input inverter to a voltage reference when a logic value of the stand-by signal is high; and
    a NAND gate to receive as input the auxiliary signal, the first enabling signal and the command signal to have a logic value that is to be high to select the low voltage functioning mode of the memory device, said NAND gate including an output to provide the pre-charge control signal to said pre-charge transistor.

16. A method for handling data read from a memory device functioning in a page mode, the memory device comprising a page buffer, a selection multiplexer coupled to the page buffer, and a global data line driver coupled to the selection multiplexer, the method comprising:
    providing the global data line driver having
        a pre-charge transistor to be turned on by a pre-charge control signal to connect an input line to a voltage reference, and
        a pre-charge control circuit to generate the pre-charge control signal based on receiving the first enabling signal, a command signal to select a low voltage functioning mode of the memory device, and inverted replica of the selected data, and a stand-by signal to set the memory device in a stand-by state;
    outputting data from the page buffer comprising a plurality of data output drivers based on the first enabling signal;
    selecting the data to be output from one of the plurality of data output drivers based on a plurality of control signals applied to the selection multiplexer; and
    transferring the selected data from the selection multiplexer to the input line of the global data line driver based on a second enabling signal.

17. The method of claim 16, wherein the global data line driver further comprises:
    a first inverter coupled to the input line for receiving the selected data;
    an internal line coupled to the first inverter for receiving the inverted replica of the selected data;
    a second inverter coupled to the internal line and to be controlled by a second enabling signal for transferring the inverted replica of the selected data; and
    an output line for receiving the transferred inverted replica of the selected data.

18. The method of claim 16, wherein the pre-charge control circuit comprises a two-input inverter to receive the inverted replica of the selected data and the stand-by signal to set the memory device in a stand-by state, the two-input inverter including an output to provide an auxiliary signal.

19. The method of claim 18, wherein a logic value of the auxiliary signal is high when a logic value of the stand-by signal is low, and a logic value of the inverted replica of the selected data is low.

20. The method of claim 18, wherein a logic value of the auxiliary signal is low when a logic value of the stand-by signal is low, and a logic value of the inverted replica of the selected data is high.

21. The method of claim 18, wherein a logic value of the auxiliary signal is to float when a logic value of the stand-by signal is high.

22. The method of claim 18, wherein the pre-charge control circuit further comprises:
    a switch to connect the output of the two-input inverter to a voltage reference when a logic value of the stand-by signal is high; and
    a NAND gate to receive as input the auxiliary signal, the first enabling signal and the command signal to have a logic value that is to be high to select the low voltage functioning mode of the memory device, the NAND gate including an output to provide the pre-charge control signal to the pre-charge transistor.

* * * * *